(12) United States Patent
Amo et al.

(10) Patent No.: US 7,235,836 B2
(45) Date of Patent: Jun. 26, 2007

(54) SEMICONDUCTOR DEVICE INCLUDING A TCAM HAVING A STORAGE ELEMENT FORMED WITH A DRAM

(75) Inventors: Atsushi Amo, Hyogo (JP); Shunji Kubo, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 41 days.

(21) Appl. No.: 11/274,299

(22) Filed: Nov. 16, 2005

(65) Prior Publication Data

US 2006/0060903 A1 Mar. 23, 2006

Related U.S. Application Data

(63) Continuation of application No. 10/890,482, filed on Jul. 14, 2004, now Pat. No. 7,005,694.

(30) Foreign Application Priority Data

Jul. 14, 2003 (JP) .............................. 2003-196444

(51) Int. Cl.
*H01L 27/108* (2006.01)
(52) U.S. Cl. ...................................... 257/296; 438/239
(58) Field of Classification Search ................ 257/296, 257/300, 303–306, 308, 311; 438/239, 253
See application file for complete search history.

(56) References Cited

U.S. PATENT DOCUMENTS 5,005,072 A * 4/1991 Gonzalez .................... 257/306
5,939,746 A 8/1999 Koyama et al.
6,262,907 B1 7/2001 Lien et al.
6,320,777 B1 11/2001 Lines et al.
6,529,397 B2 3/2003 Takeda et al.

OTHER PUBLICATIONS

Atsushi Amo, et al, "Semiconductor Device and Manufacturing Method Thereof" U.S. Appl. No. 10/455,371, filed Jun. 6, 2003, pp. 1-46, Format Art pp. 1-14, Ref. #G715US.

* cited by examiner

*Primary Examiner*—David Vu
(74) *Attorney, Agent, or Firm*—McDermott Will & Emery LLP

(57) ABSTRACT

In order to improve the discharging speed of potential from a match line, a semiconductor device includes a capacitor, a memory transistor having a source/drain region connected to a storage node of the capacitor, a search transistor having a gate electrode connected to the storage node, and a stacked contact connecting a match line and the source/drain region of the search transistor. The storage node has a configuration in which a sidewall of the storage node facing the match line partially recedes away from the stacked contact such that a portion of the sidewall in front of the stacked contact in plan view along the direction of the match line is located farther away from the stacked contact than the remaining portion of the sidewall.

6 Claims, 9 Drawing Sheets

SEMICONDUCTOR DEVICE INCLUDING A TCAM HAVING A STORAGE ELEMENT FORMED WITH A DRAM

RELATED APPLICATION

This application is a continuation of application Ser. No. 10/890,482 filed Jul. 14, 2004, now U.S. Pat. No. 7,005,694 which claims priority to Japanese Application No. 2003-196444, filed Jul. 14, 2003, both of which are incorporated herein by reference.

BACKGROUND OF THE INVENTION

1. Field of the Invention

The present invention relates to a semiconductor device including a TCAM (Ternary Content Addressable Memory) having a storage element formed with a DRAM (Dynamic Random Access Memory).

2. Description of the Background Art

As a memory storing information in a TCAM, SRAMs (Static Random Access Memory) are generally employed and available as a product. When an SRAM is employed, a total of 16 transistors, i.e. 12 transistors corresponding to two CMOS-SRAMs and 4 search transistors for a search operation, is required per cell. Therefore, the cells occupy a large area to become a bottleneck in reducing the size of the apparatus. In view of the foregoing, an approach of forming the storage memory unit with a DRAM has been proposed. (For example, refer to U.S. Pat. Nos. 6,262,907B1, 6,320,777B1 and 6,529,397B2.

In general, the cell of a TCAM is composed of a retain transistor unit identified as a storage memory, and a search transistor unit. When a DRAM is employed for the retain transistor unit, two DRAM memory transistors, and two capacitors connected to the source/drain region of that memory transistor are arranged at the retain transistor unit. At the search transistor unit, a first search transistor having its gate connected to the storage node of the two capacitors, and driven by the node, and a second search transistor having its source/drain region connected with the source/drain region of the first search transistor are arranged.

A capacitor stores digital information by retaining charge. A TCAM memory cell is arranged at a position where a word line WL and a match line ML cross a bit line open BL, a search line SL, and a complementary search line/SL. The TCAM memory cells are arranged in a matrix to carry out charge processing (for example, refer to U.S. Pat. No. 6,262,907B1).

In a TCAM, the three combinations of (High, Low), (Low, High), (Low, Low) of the storage node potentials of the two capacitors are set to correspond to the ternary. Between match line ML and the ground potential are arranged two rows of search transistors, i.e. first and second search transistors corresponding to the two capacitors set forth above, having their source/drains connected to each other. When one of the two rows attains an ON state from the match line to the ground, the potential of match line ML is pulled to GND, otherwise, match line ML remains at the level of precharged potential. In practice, a plurality of TCAM cells are connected to one match line. In the case where the potential of the match line is not pulled out by all the cells, the search corresponds to a match. Data search is conducted readily by using a semiconductor device for searching set forth above.

The performance of such a semiconductor device with a search function is evaluated based on the sps (search per second) unit indicating how many times a search can be conducted in one second. A general search device carries out searching at, for example, 100 M (mega) sps, i.e. in the order of $10^8$ times in one second. In such a search operation, the pull down speed of a potential from a match line ML at a high state is a critical factor for high speed operation. The discharge of potential from match line ML can be increased in speed by: (a1) reducing the capacitance of match line ML; and (a2) increasing the drivability of the search transistor that draws out charge.

SUMMARY OF THE INVENTION

An object of the present invention is to provide a semiconductor device including a TCAM having a storage element with a DRAM, which can have the discharge speed of potential from a match line improved.

A semiconductor device according to an aspect of the present invention includes a cell electrically connected to a metal line. The cell includes a capacitor, a memory transistor having a source/drain region connected to a storage node of the capacitor, a search transistor having a gate electrode connected to the storage node of the capacitor, and a stacked contact electrically connecting a match line of the metal line with the source/drain region of the search transistor. The storage node has a configuration in which a sidewall of the storage node facing the stacked contact partially recedes away from the stacked contact such that a portion of the sidewall in front of the stacked contact in plan view along the direction of the match line is located farther away from the stacked contact than the remaining portion of the sidewall.

A semiconductor device according to another aspect of the present invention includes a cell electrically connected to a metal line. The cell includes a capacitor, a memory transistor having a source/drain region connected to a storage node of the capacitor, a search transistor having a gate electrode connected to the storage node of the capacitor, and a stacked contact electrically connecting a match line of the metal line with the source/drain region of the search transistor. The storage node has a configuration in which a sidewall of the storage node facing the stacked contact partially recedes away from the stacked contact such that a region including a side edge portion of the sidewall in front of the stacked contact in plan view along the direction of the match line is cut out from a rectangle with the remaining portion of the side edge portion left.

By virtue of the semiconductor device set forth above, the distance from the stacked contact that connects a match line with the source/drain region of the search transistor to the capacitance contributing portion of the storage node can be increased to reduce the capacitance of the match line. As a result, the operation of the TCAM can be increased in speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 3:
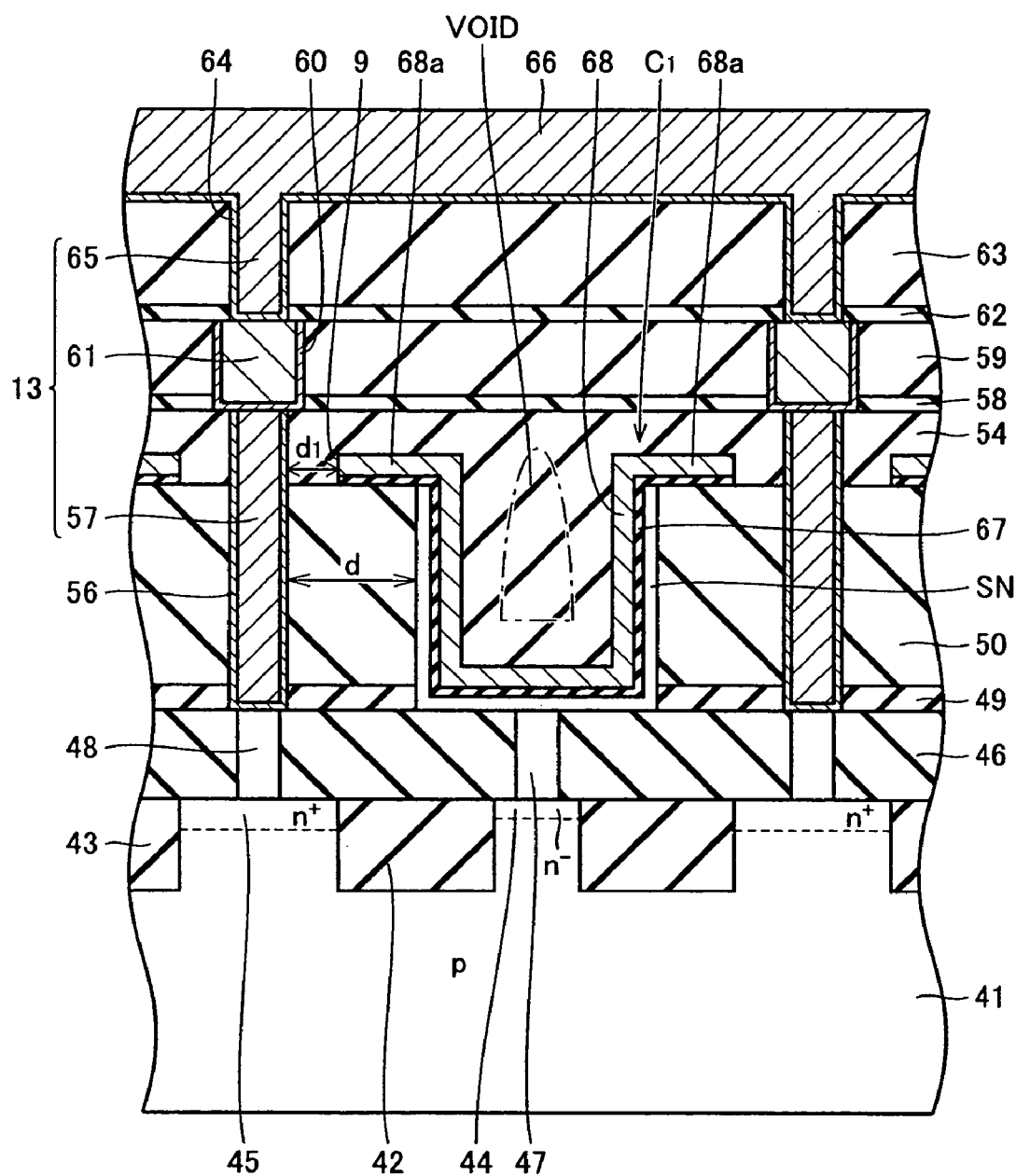
FIG. 3 is a sectional view of a TCAM cell taken along line III–III' of FIG. 1.
Figure 4:
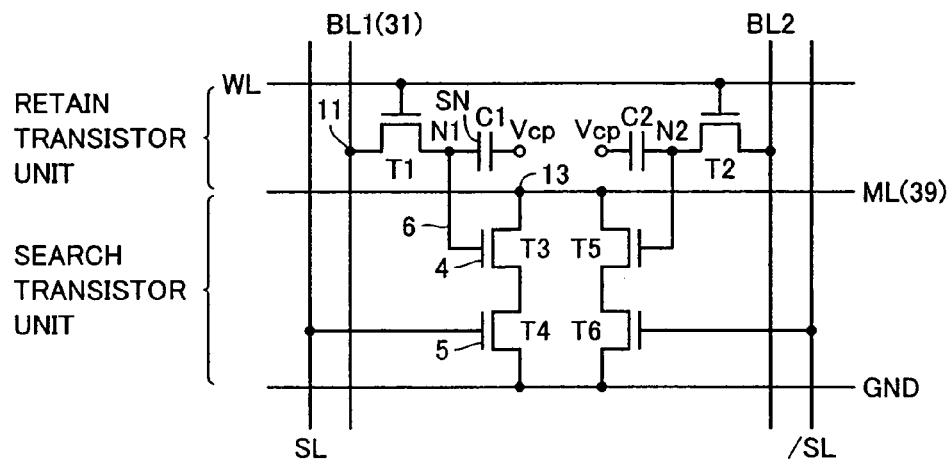
FIG. 4 is a circuit diagram of a TCAM cell of FIG. 1.
Figure 5:
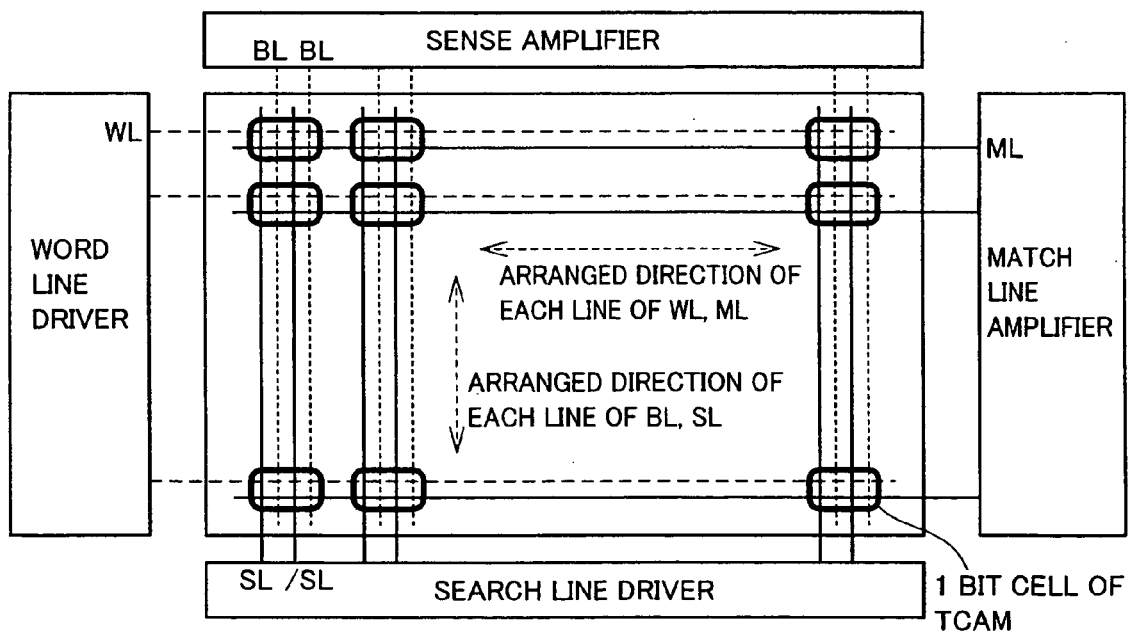
FIG. 5 is a plan view of a semiconductor device for searching having TCAM cells arranged in a matrix of rows and columns.

FIGS. 1–5 correspond to a semiconductor device according to a first embodiment of the present invention. In the circuit diagram of FIG. 4 corresponding to one bit of a TCAM cell identified as the present semiconductor device, the edge of the storage node at the stacked contact side recedes away from the stacked contact so that the distance therebetween is increased. FIG. 5 represents an entire configuration of a semiconductor device for searching having the foregoing one bit of TCAM cells arranged.

Referring to FIG. 4, a word line WL and a bit line BL are arranged so as to cross each other, likewise a general DRAM. Data is written and read with respect to a capacitor in a TCAM cell disposed at the crossing between a word line and a bit line. The word line is connected to a word line driver that drives that word line. A bit line BL is connected to a sense amplifier that reads and writes data.

A search line SL and a complementary search line /SL form a pair of search lines. Both search lines are connected to a search line driver. Match line ML is connected to a match line amplifier that senses the state of that match line. In the embodiment of FIG. 4, TCAM cells are arranged in a two-dimentional manner to constitute a memory array. One word line WL, two bit lines BL, one pair of search lines (SL, /SL) and one match line ML are connected to one TCAM cell. Although not depicted in FIG. 4, a GND line supplying ground potential and a cell plate identified as an opposite electrode of the capacitor are associated with a memory array.

Two bit lines BL1 and BL2 are explicitly illustrated in the TCAM cell circuit configuration of FIG. 4 since they are independent lines, not constituting a pair. They are required to write LOW to the two capacitors in the TCAM cell. For the sake of a bit line pair, an open bit line architecture or the like that forms a pair with a bit line of another cell array is applied. A cell plate potential Vcp is applied to the cell plates of two capacitors C1 and C2. A common ground potential line GND is connected to the source/drain region of one of search transistors that will be described afterwards having its gate connected to a search line or a complementary search line.

Six transistors and two capacitors constitute one TCAM cell. Transistors T1 and T2 are memory transistors introducing charge into respective capacitors C1 and C2 for writing (referred to as "retain transistor" hereinafter). Transistors T3, T4, T5 and T6 are transistors that conduct a search operation of the TCAM (referred to as "search transistor" hereinafter). The gate electrode of search transistor T3 is connected to a node N1. The gate transistor of search transistor T4 is connected to a search line SL. Similarly, search transistors T5 and T6 have their gate electrodes connected to a node N2 and a complementary search line, respectively.

Figure 1:
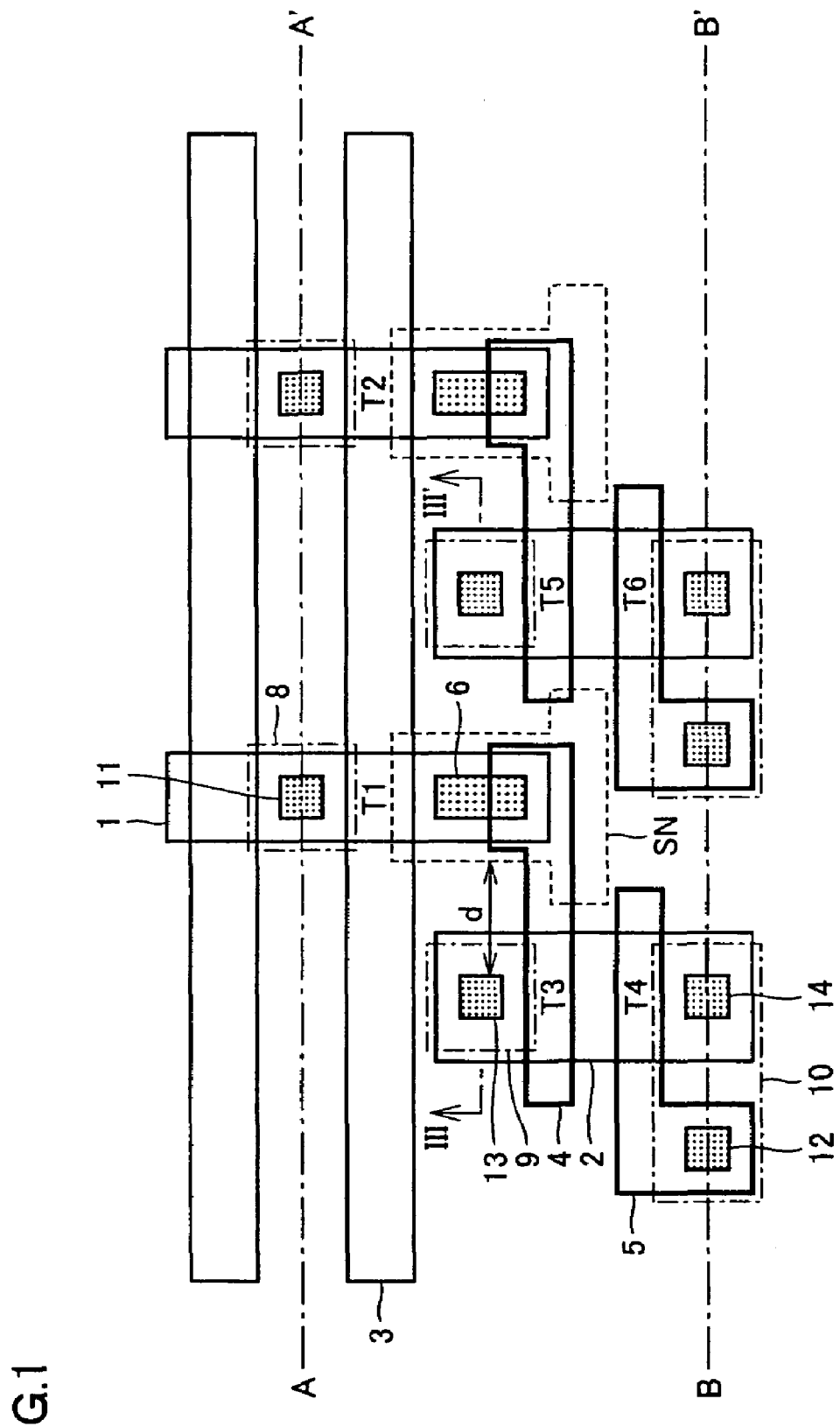
FIG. 1 is a plan view of a TCAM cell according to a first embodiment of the present invention.

Referring to FIG. 1, an active region 1 is provided at retain transistor T1. Additionally, an active region 2 is provided at search transistors T3 and T4. A common gate electrode 3 is provided for retain transistors T1 and T2. A gate 4 of search transistor T3 is connected to node N1, i.e., a storage node. A gate 5 of search transistor T4 is connected to a search line. The reference characters of T1–T6 designated at the channel regions overlapping the gate of respective transistors correspond to respective transistors in the circuit diagram of FIG. 4.

A shared contact 6 has a capacitor lower electrode (storage node) SN connected to one source/drain region of retain transistor T1 and to gate 4 of search transistor T3. This connection through shared contact 6 is effected by the step of forming an opening of a bit line contact and a storage node contact at the same time. Cell plate hole patterns 8, 9 and 10 are indicated corresponding to transistors T1, T3 and T4, respectively. The remaining region after such rectangular hole patterns are bored corresponds to a cell plate. In the plan view of FIG. 1, stacked contacts 11, 12, 13 and 14 having a lower BS plug and an upper contact stacked are depicted. As used herein, a BS plug refers to the plug of a bit line contact or a storage node contact. Stacked contact 11 connects one source/drain of retain transistor T1 to the bit line. Stacked contact 12 connects an active gate of a search transistor to a search line. Stacked contact 13 connects an active region to a match line. Stacked contact 14 connects an active region to a GND line.

The present embodiment is characterized in that the side edge of storage node SN facing stacked contact 13 partially recedes away from stacked contact 13, whereby the distance d between storage node SN and stacked contact 13 is increased.

Lines A–A' and B–B' are auxiliary lines, indicating that the cells, when arranged in an array, are axially symmetric about respective auxiliary lines. Although only one cell is depicted along the direction of such auxiliary lines, the cell array has translational symmetry along the direction of the auxiliary line. The above description to retain transistor T1, as well as to search transistors T3 and T4 apply to retain transistor T2 and search transistors T5 and T6, respectively.

Figure 2:
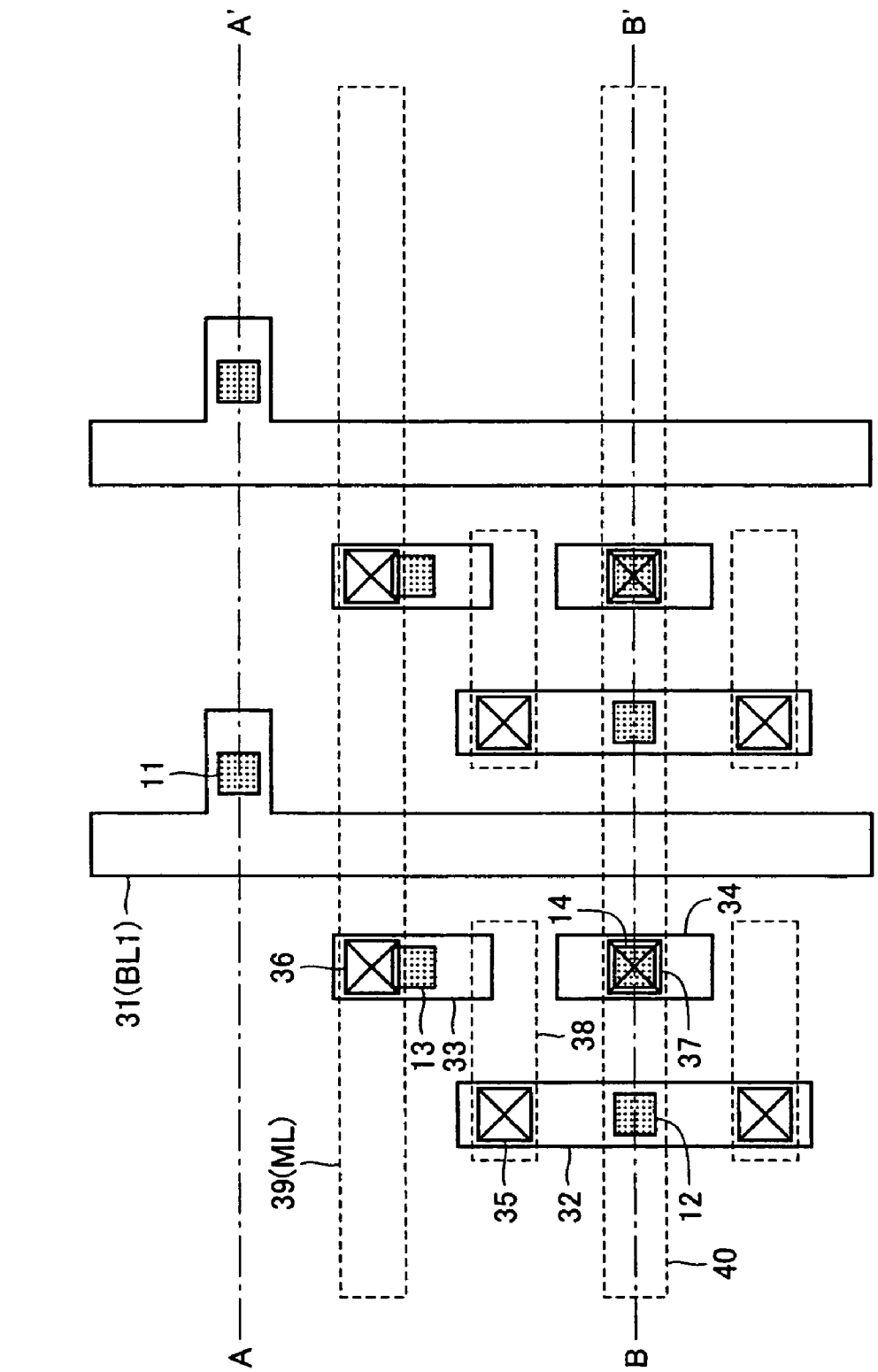
FIG. 2 is a plan view of a configuration of a layer upper than the plan view of FIG. 1.

In the arrangement of an upper layer above the stacked contact of FIG. 2, auxiliary lines A–A' and B–B' are symmetric lines located at positions identical to those of FIG. 1. Stacked contacts 11, 12, 13 and 14 are identical to those of FIG. 1. A bit line 31 is formed of a first metal line. A metal pad 32 to pull up a search line is also formed of the first metal line. Additionally, a metal pad 33 to pull up a match line and a metal pad 34 to pull up a GND line are formed of the first metal line.

Furthermore, a first through hole 35 to pull up a search line to a further upper layer, a first through hole 36 to pull up a match line to an upper layer, and a first through hole 37 to pull up a GND line to an upper layer are provided.

The wiring set forth below are formed of a second metal line. A metal pad 38 to pull up a search line to a further upper layer, a match line 39 of the upper layer, and a GND line 40 of the upper layer are respectively formed. The search line of the present embodiment is formed of a metal line of a further upper layer, for example, formed of a third metal line. The arrangement of such further upper layers will not be described here since they deviate from the characteristic feature of the present embodiment.

Referring to the sectional view of FIG. 3 taken along line III–III' of FIG. 1, isolation oxide films 42 and 43 are provided at the surface layer of a p type silicon substrate 41. At the element region between the isolation oxide films, an n⁻ diffusion layer 44 of a retain transistor at the storage node side and an n⁺ diffusion layer 45 of a match line contact of a search transistor are formed. A BS interlayer insulation film 46 and BS polysilicon plugs 47 and 48 are located on silicon substrate 41. A nitride film 49 is disposed on BS interlayer insulation film 46 to temporarily stop the etching of the storage node and the first contact. A storage node interlayer insulation film 50 is deposited on nitride film 49.

A capacitor is formed of a storage node SN identified as the lower electrode of a capacitor, a dielectric film 67 above storage node SN, and a cell plate 68 identified as an upper electrode. A cell plate flat region 68a extends over interlayer insulation film 50. A first contact interlayer insulation film 54 is deposited on this cell plate. If a plasma oxide film or the like that has poor coverage is employed in depositing first contact interlayer insulation film 54, there is a possibility of a void V indicated by the chain dotted line generated at the recess of the capacitor depending upon the condition.

A first contact 57 and a barrier metal 56 thereof formed of tungsten (W) are provided piercing first contact interlayer insulation film 54. The first metal line of the present embodiment is formed of a copper (Cu) line by single damascene. An etching stopper film 58 formed of a nitride film is disposed on first contact interlayer insulation film 54. An insulation film 59 is formed on etching stopper film 58, in which a first interconnection layer 61 is embedded. First interconnection layer 61 is formed piercing insulation film 59 with barrier metal 60 therebetween.

A second interconnection layer of the present embodiment is formed of a Cu line by dual damascene. An etching stopper film 62 formed of a nitride film is disposed on insulation film 59. A first through hole interlayer insulation film 63 is deposited upon etching stopper film 62. A first through hole unit formed of a Cu line by dual damascene is provided piercing first through hole interlayer insulation film 63 with barrier metal 64 therebetween. A second interconnection layer 66 is arranged on this first through hole unit. The arrangement of a metal line of a further upper layer will not be described here since they deviate from the characteristic feature of the present embodiment.

The operation of a TCAM cell set forth above will be described based on Table 1 hereinafter. The data storage state of one TCAM cell includes the three type set forth below. Ternary of the TCAM corresponds to these three types. Specifically, they correspond to (N1, N2)=(High, Low), (Low, High) and (Low, Low). The states of data search also includes three types, i.e. (SL, /SL)=(High, Low), (Low, High) and (Low, Low). The row contributing to match line ML indicates what change in state will occur with respect to a match line ML having the cell previously pulled up to a high state when a search is conducted with the search data of (SL, /SL) for a TCAM cell at the storage state of (N1, N2).

TABLE 1

| Node potential | | Search line potential | | Contribution to | State of search data with respect of |
|---|---|---|---|---|---|
| N1 | N2 | SL | /SL | match line ML | stored data |
| High | Low | High | Low | High → Low | Non-match |
|  |  | Low | High | High → High | Match |
|  |  | Low | Low | High → High | Mask |
| Low | High | High | Low | High → High | Match |
|  |  | Low | High | High → Low | Non-match |
|  |  | Low | Low | High → High | Mask |

TABLE 1-continued

| Node potential | | Search line potential | | Contribution to | State of search data with respect of |
|---|---|---|---|---|---|
| N1 | N2 | SL | /SL | match line ML | stored data |
| Low | Low | High | Low | High → High | Mask |
|  |  | Low | High | High → High | Mask |
|  |  | Low | Low | High → High | Mask |

The combination contributing to transition of match line ML from a High state to a Low state includes the two types of: searching by (SL, /SL)=(High, Low) for (N1, N2)=(High, Low); and searching by (SL, /SL)=(Low, High) for (N1, N2)=(Low, High). The former corresponds to the case where transistors T3 and T4 of FIG. 4 connected in series are turned ON, and match line ML is pulled down to GND from a High state. The latter corresponds to the state where transistors T5 and T6 connected in series are turned ON. These are referred to as a non-match state of search data (SL, /SL) with respect to stored data (N1, N2).

In contrast, a matching state includes the cases where search data (SL, /SL)=(Low, High) for stored data (N1, N2)=(High, Low), and search data (SL, /SL)=(High, Low) for stored data (N1, N2)=(Low, High). They do not contribute to pulling down match line ML to GND since one of the transistors of transistors T3 and T4 and transistors T5 and T6 connected in series is OFF although the other is ON.

Further, there is a mask state where match line ML is not pulled to GND. When the stored data attains a mask state (N1, N2)=(Low, Low), or the search data attains a mask state (SL, /SL)=(Low, Low), the transistors connected in series do not conduct current. Therefore, match line ML is not discharged to GND.

The above description applies to one TCAM cell. In practice, the data storage and data searching set forth above are carried out over all the cells arranged in the array in the TCAM operation. As shown in FIG. 5, a plurality of TCAM cells are connected to one match line ML. Data search is conducted simultaneously for all the TCAM cells connected to one match line ML. Therefore, if there is even one non-match cell for one match line ML, match line ML will be discharged from high to low. Match line ML maintains a High state only when all the cells connected to one match line ML have a matching state or a mask state with respect to the search data. Thus, a TCAM operation is carried out in which a search is conducted on stored data, i.e. stored contents, based on match lines ML remaining with a High state for only matching data (including mask state) with respect to the search data, and indicating the address of the corresponding match (including mask state). The affix T (Ternary) is attached, implying that there are three values including a mask state in addition to a match state and a non-match state. Those absent of a mask state are called Binary CAM, or simply CAM.

Figure 6:
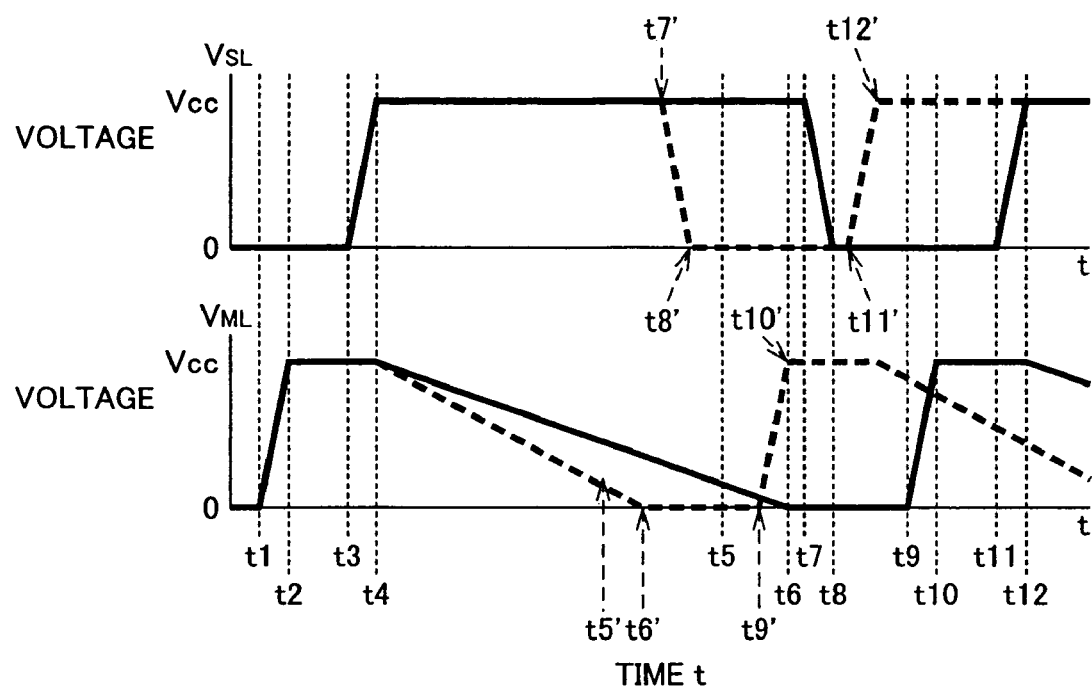
FIG. 6 shows the voltage swing in a search line and a match line.

The searching speed of the TCAM of the present invention will be described hereinafter with reference to FIG. 6. FIG. 6 represents the transition of a potential ($V_{SL}$) of a search line SL and a potential ($V_{ML}$) of a match line ML over time, i.e., along the time axis (t). Match line ML initially attaining a Low state rises from time $t_1$ to attain a High state of Vcc at time $t_2$. Then, a search commences, whereby the current search line SL rises from time $t_3$ to attain the level of Vcc at time $t_4$. The current match line ML is discharged to GND by a non-match, falling down from time $t_4$ (simplification, actually falling down during time $t_3$ to $t_4$ in practice), and attains the level of zero (0) volt at time $t_6$.

Time $t_5$ corresponding to the level of $V_{ML}$ that is ⅓ Vcc represents the threshold value for the match line amplifier to make a determination that match line ML attains a Low state. The match line amplifier starts its operation from time $t_5$. At the elapse of a margin time required to complete determination that all match lines of a non-match state have been pulled down, search line SL begins to fall from time $t_7$ and attains the level of zero (0) volt at time $t_8$.

Then, for the next search, match line ML begins to rise at time $t_9$ to attain the level of Vcc at time $t_{10}$. Search line SL begins to rise for search again from time $t_{11}$ to attain the level of Vcc at time $t_{12}$, and match line ML of a non-match begins to fall.

In addition to the above-described signal $V_{SL}$ and signal $V_{ML}$ indicated in solid lines in FIG. 6, a signal $V_{SL}$ and a signal $V_{ML}$ are indicated in dotted lines. It is to be noted that, following the rise of match line ML during time $t_1$–$t_2$ and the rise of search line SL during time $t_3$–$t_4$ conducted at the same time as those of the solid lines, signal $V_{ML}$ of the dotted line rises earlier than signal $V_{ML}$ of the solid line. According to the voltage transition following the dotted line, the threshold value for Low determination by the match line amplifier comes at time $t_5'$ earlier than time $t_5$, and match line ML attains the level of zero (0) volt at time $t_6'$ earlier than time $t_6$. Therefore, the subsequent operation corresponding to the dotted line is carried out earlier than that corresponding to the solid line. Search line SL falls at time $t_7'$–$t_8'$, and match line ML rises at time $t_9'$–$t_{10}'$. At time $t_{11}'$–$t_{12}'$, search line SL for the next search rises. The fall of a match line of a non-match state starts from time $t_{12}'$.

The time required for one search can be regarded as the starting time of the rise of the search line to the starting time of the rise of the search line for the next search. For the voltage swing corresponding to the solid line, the time required for one search is ($t_{11}$–$t_3$). For the voltage swing corresponding to the dotted line, the time required for one search is ($t_{11}'$–$t_3$). Since $t_{11}'<t_{11}$, the following relationship is established.

$$t_{11}'-t_3 < t_{11}-t_3$$

It is therefore appreciated that the time required for one search is shorter in the case corresponding to the dotted line. In accordance with the present embodiment, the capacitance of the match line can be reduced by setting the distance d between the storage node and the stacked contact larger than that of a conventional configuration, as will be described afterwards. Accordingly, assuming that the conventional configuration corresponds to the voltage swing of the solid lines in FIG. 6, the voltage swing of the dotted line can be realized in the present embodiment.

As mentioned previously, the distance d between stacked contact (first contact) 13 connected to the match line and storage node SN becomes a critical factor in the capacitance of match line ML. The capacitance of a match line includes the coupling capacitance between an adjacent line and an upper line, as well as the capacitance with respect to the substrate. In the configuration of the present embodiment, the coupling capacitance between stacked contact 13 and storage node SN is a major factor. When the storage node is as high as 0.5 to 2 μm, and the storage node is increased in plan view to ensure a large capacitance of a capacitor, the foregoing distance d is so small that the coupling capacitance will occupy approximately half the entire capacitance of the match line. In the present embodiment, distance d can be increased by the storage node taking a configuration in which the side edge facing the stacked contact recedes away from the stacked contact in plan view instead of taking a simple rectangle. Thus, the capacitance of the match line can be reduced as compared to a conventional case to prevent the capacitance of the match line from becoming a bottleneck in increasing the searching speed.

The shape of storage node SN of FIG. 1 in plan view is not a simple analogous reduction of a rectangle. The shape of storage node SN in plan view has the side edge portion partially cut away. Therefore, the area of the sidewall of the storage node is identical to that of a conventional rectangular storage node without a cutaway. Although the capacitance of a capacitor generally corresponds to the sum of the portion contributing to the area of the sidewall and the portion contributing to the area of the bottom, it is to be noted that the contribution of the area of the sidewall is greater than that of the area of the bottom since the sidewall area is larger than the bottom area in the recess cylindrical capacitor of the present embodiment. Therefore, although the capacitance of the capacitor of the storage node that has a cut away configuration is slightly reduced by the reduction of the bottom area, the area of the sidewall is identical to that of a storage node absent of a cutaway, so that this reduction in capacitance is small. By virtue of the present embodiment, the data searching speed can be increased with little degradation in the data storage capability in a TCAM cell that employs a DRAM cell as a memory cell.

Second Embodiment

Figure 7:
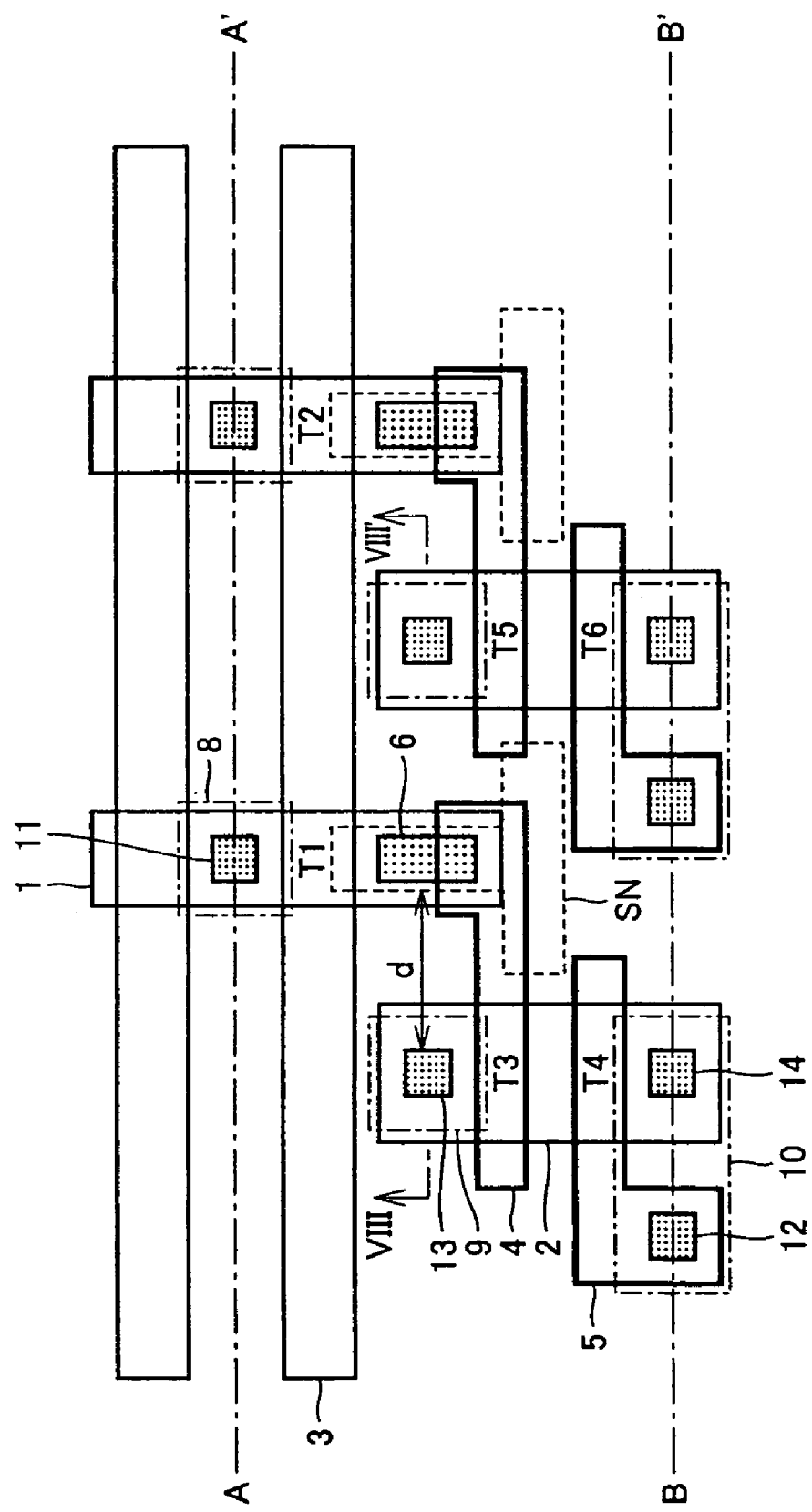
FIG. 7 is a plan view of a TCAM cell according to a second embodiment of the present invention.
Figure 8:
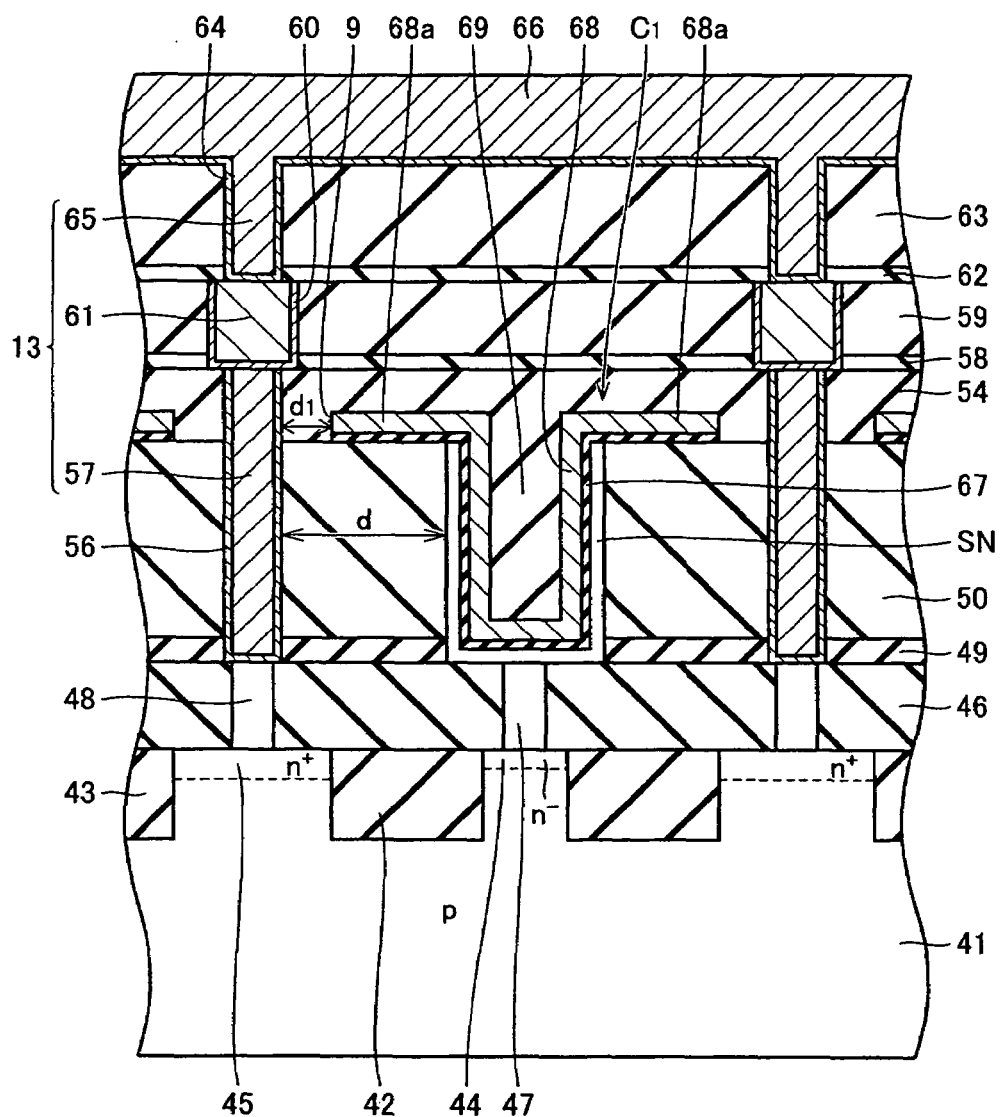
FIG. 8 is a sectional view of the TCAM cell taken along line VIII–VIII' of FIG. 7.

FIGS. 7 and 8 correspond to a TCAM cell identified as a semiconductor device according to a second embodiment of the present invention. The second embodiment is basically a modification of the first embodiment. Storage node SN takes a reverse T shape so as to further increase the distance d from stacked contact 13 as compared to the first embodiment. The width of respective portions of storage node SN corresponding to the arm and the stem of the T shape, i.e., the horizontal region and vertical region, is set to the smallest width required to form a recess cylindrical capacitor.

Referring to FIG. 8, a capacitor includes a storage node SN of a lower electrode, a dielectric film 67, and a cell plate 68 of an upper electrode. A cell plate flat portion 68a is formed on interlayer insulation film 50. The recess portion 69 of the recess cylindrical capacitor is filled with interlayer insulation film 54 to suppress generation of a void. Generation of a void is suppressed since storage node SN has a T-shape in plan view, reduced in the width of each region. Generation of a void is disadvantageous in that, during formation of a first interconnection layer, the interconnection layer will fill the void to induce short-circuiting, or the barrier metal will not be formed so as to completely surround the copper line, which will induce downward diffusion of copper from the copper line to increase the possibility of a defect.

In the present embodiment, the width of respective regions in the storage node of a T shape in plan view is set to the limit that allows formation of a recess cylindrical capacitor. Accordingly, distance d can be further increased to further reduce the capacitance of the match line as compared to that of the first embodiment. Although the capacitance of the capacitor is reduced corresponding to the smaller bottom area of the storage node, the area of the sidewall does not change even if the capacitor takes a T shape in plan view. Therefore, degradation in the data retaining property of the DRAM is small. Furthermore, generation of a void in recess 69 of the capacitor is suppressed to prevent generation of a defect such as short-circuiting.

Third Embodiment

Figure 9:
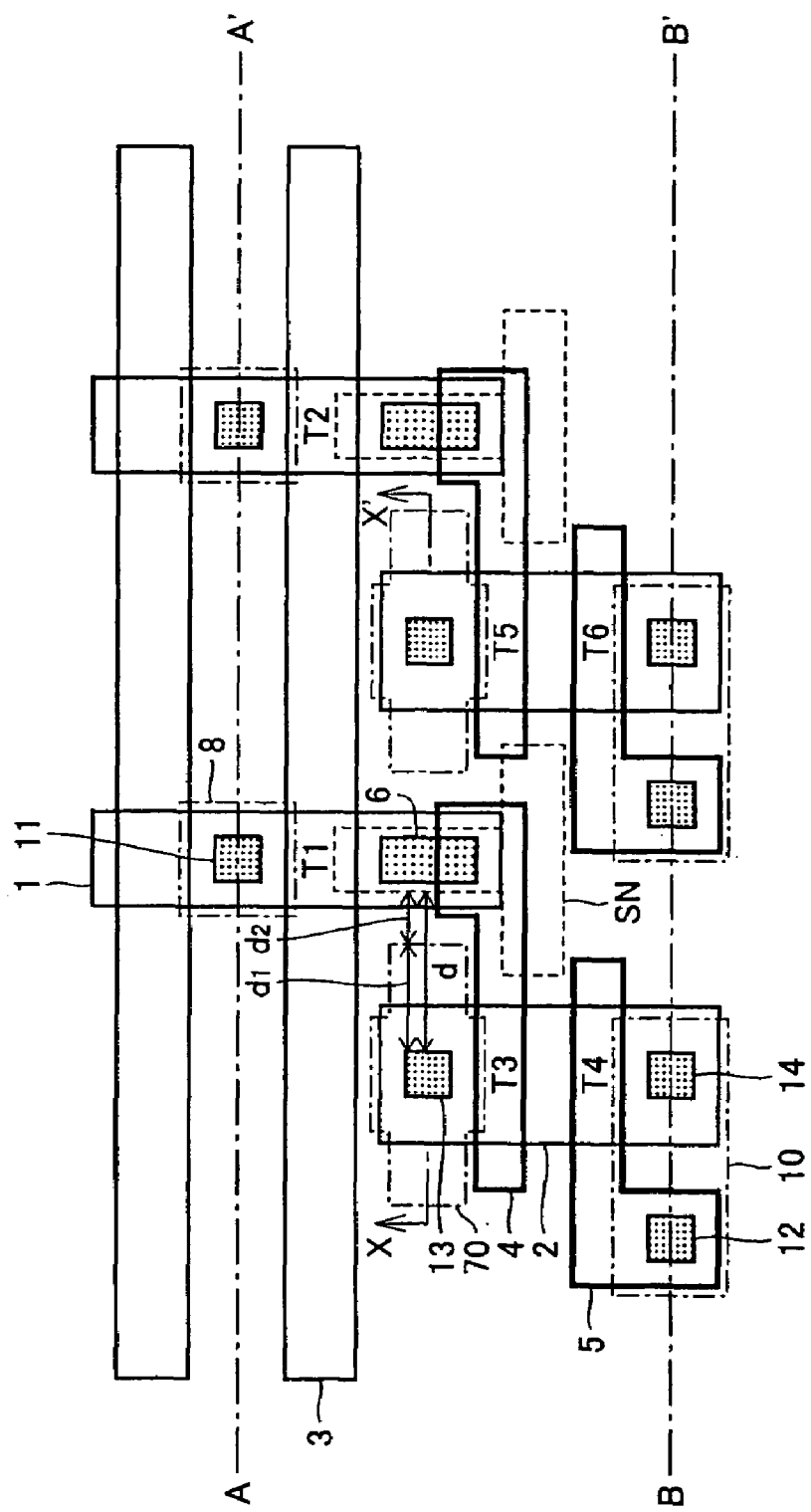
FIG. 9 is a plan view of a TCAM cell according to a third embodiment of the present invention.
Figure 10:
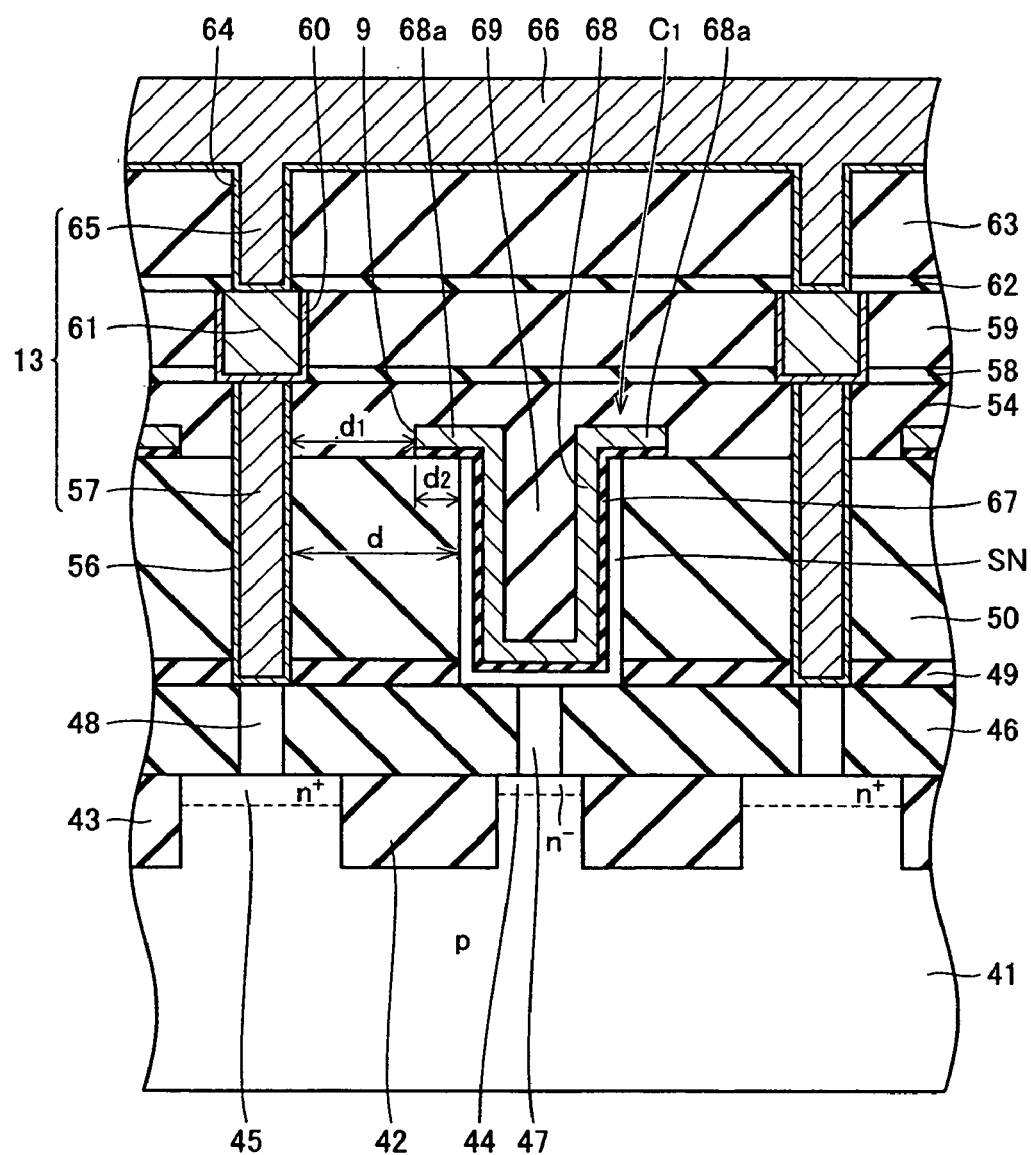
FIG. 10 is a sectional view of the TCAM cell taken along line X–X' of FIG. 9.

A TCAM cell that is a semiconductor device according to a third embodiment of the present invention is shown in FIGS. 9 and 10. The present embodiment is a modification of the second embodiment. The present embodiment is characterized in that hole pattern 9 formed at cell plate flat portion 68*a* in stacked contact 13 is increased than hole pattern 10 of FIGS. 1 and 7 in the direction along auxiliary line A–A'. As a result, the edge of the cell plate is located closer to the recess cylindrical portion, whereby distance d1 between stacked contact 13 and the edge of hole pattern 9 of cell plate flat portion 68*a* is larger than distance d1 of the second embodiment. Distance d1 between stacked contact 13 and the edge of hole pattern 9 of the cell plate shown in FIG. 10 is larger than that of the conventional case. Referring to FIG. 9, the cell plate extends out from storage node SN by a distance d2 required to cover storage node SN.

In accordance with the above-described configuration, the capacitance of the match line can be reduced by increasing the distance d1 between stacked contact 13 connected to match line ML and the cell plate. As a result, the search operation of the TCAM can be further increased in speed.

The embodiments of the present invention will be summarized hereinafter including those set forth above.

The above embodiment was described in which the storage node is axially symmetric about the center line passing through the center of the storage node, parallel to the bit line. Storage node does not necessarily have to take a symmetric configuration about the center line. However, since the area of the sidewall facing the stacked contact is large due to the partial recession, the area of the sidewall at the opposite side can also be increased by taking an axially symmetric configuration about the center line. Accordingly, reduction in the capacitance caused by setting the sidewall in a receding manner can be prevented.

In the above-described semiconductor device having the sidewall of the storage node facing the stacked contact partially receding and the above-described semiconductor device having the sidewall of the storage node facing the stacked contact partially cut away, the storage node may include a first rectangular strip extending along the direction of the match line in plan view, and a second rectangular strip extending outwards in a direction crossing the match line from a side portion differing from the leading end of the first rectangular unit facing the stacked side, wherein the side portion of the second rectangular strip includes a portion of a region in front of the stacked contact along the direction of the match line.

The first rectangular strip may be taken as the arm of an inversed T shape whereas the second rectangular strip may be taken as the stem of an inversed T shape. If the above-described axial symmetricy about the center line is of no concern, the first rectangular strip may be the arm region of an L shape or a mirror-reversed L shape whereas the second rectangular strip may be the stem portion of an L shape or a mirror-reversed L shape.

In any of the semiconductor devices set forth above, a capacitor has a cylindrical shape, and a cell plate located corresponding to a storage node so as to sandwich a dielectric film includes a cell plate flat portion extending above and along an interlayer insulation film in which a capacitor is embedded, from the top and outside the cylinder. The cell plate flat portion has a hole pattern including a stacked contact in plan view. The length of the hole pattern in the direction along the match line may be set longer than the direction crossing the match line.

By virtue of the above-described configuration, distance d1 between stacked contact 13 connected to a match line and the cell plate can be increased to reduce the capacitance of the match line. Thus, the searching operation of the TCAM can be further increased in speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a cell electrically connected to metal lines,
   wherein said cell comprises
   a capacitor,
   a memory transistor having a source/drain region connected to a storage node of said capacitor,
   a search transistor having a gate electrode connected to the storage node of said capacitor, and
   a contact electrically connecting a match line included among said metal lines with a source/drain region of said search transistor, said match line extending in a first direction,
   wherein said storage node comprises a first portion having a first width in said first direction in plan view and a second portion having a second width larger than said first width in said first direction in plan view.

2. The semiconductor device according to claim 1, wherein said contact is adjacent to said first portion in said first direction.

3. The semiconductor device according to claim 1, wherein said storage node is symmetric about one center line of said storage node extending in a second direction perpendicular to said first direction, and is asymmetric about another center line of said storage node extending in said first direction, in plan view.

4. The semiconductor device according to claim 1, wherein said storage node has opposite sides in a second direction perpendicular to said first direction, and a first side at said first portion side is shorter in length than a second side at said second portion side.

5. The semiconductor device according to claim 1, wherein said storage node is reduced stepwise in width from said second portion towards said first portion.

6. The semiconductor device according to claim 1, wherein said capacitor has a cylindrical configuration, and a cell plate located with respect to said storage node so as to sandwich a dielectric film has a cell plate flat portion extending above and along an interlayer insulation film in which said capacitor is embedded, from a top and outside of said cylinder, and said cell plate flat portion has a hole pattern including said contact in plan view, said hole pattern having a length in a direction along said match line longer than in a direction crossing said match line.

* * * * *